(12) United States Patent
Chen et al.

(10) Patent No.: US 7,564,675 B2
(45) Date of Patent: Jul. 21, 2009

(54) FACE-CENTERED CUBIC STRUCTURE CAPACITOR AND METHOD OF FABRICATING THE SAME

(75) Inventors: I-Hsun Chen, Hsinchu (TW); Szu-Kang Hsien, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 277 days.

(21) Appl. No.: 11/798,874

(22) Filed: May 17, 2007

(65) Prior Publication Data

US 2008/0158776 A1    Jul. 3, 2008

(30) Foreign Application Priority Data

Dec. 29, 2006    (TW) .............................. 95150072 A

(51) Int. Cl.
*H01G 4/005* (2006.01)
*H01G 4/06* (2006.01)

(52) U.S. Cl. ................... 361/303; 361/311; 29/25.42

(58) Field of Classification Search ......... 361/303–305, 361/311; 29/25.42, 25.41
See application file for complete search history.

(56) References Cited

U.S. PATENT DOCUMENTS

| | | | |
|---|---|---|---|
| 5,208,725 A | 5/1993 | Akcasu | |
| 5,939,766 A * | 8/1999 | Stolmeijer et al. | 257/534 |
| 6,037,621 A | 3/2000 | Wilson | |
| 6,297,524 B1 | 10/2001 | Vathulya et al. | |
| 6,410,954 B1 | 6/2002 | Sowlati et al. | |
| 6,597,562 B1 * | 7/2003 | Hu et al. | 361/306.3 |
| 6,635,916 B2 * | 10/2003 | Aton | 257/306 |
| 6,737,698 B1 | 5/2004 | Paul et al. | |
| 6,765,778 B1 | 7/2004 | Du et al. | |
| 6,784,050 B1 * | 8/2004 | Aram et al. | 438/240 |
| 6,819,542 B2 * | 11/2004 | Tsai et al. | 361/304 |
| 2004/0036143 A1 | 2/2004 | Hu et al. | |
| 2004/0174655 A1 | 9/2004 | Tsai et al. | |
| 2005/0280060 A1 | 12/2005 | Juengling | |

* cited by examiner

*Primary Examiner*—Eric Thomas
(74) *Attorney, Agent, or Firm*—Birch, Stewart, Koloasch & Birch, LLP

(57) ABSTRACT

A face-centered cubic structure capacitor is provided, which includes a first metal layer, a second metal layer, and a connection layer. The first metal layer comprises a plurality of first metal wires, a plurality of second metal wires, and a plurality of first metal blocks. The first and second metal wires are intercrossed with each other to form a grid structure, and each of the first metal blocks is disposed in each grid of the grid structure. The second metal layer comprises a plurality of third metal wires, a plurality of fourth metal wires, and a plurality of second metal blocks. The third and fourth metal wires are intercrossed with each other to form a grid structure, and each of the second metal blocks is disposed in each grid of the grid structure. The connection layer comprises a plurality of third metal blocks and a plurality of fourth metal blocks.

12 Claims, 5 Drawing Sheets

FACE-CENTERED CUBIC STRUCTURE CAPACITOR AND METHOD OF FABRICATING THE SAME

CROSS-REFERENCE TO RELATED APPLICATIONS

This non-provisional application claims priority under 35 U.S.C. § 119(a) on Patent Application No(s). 095150072 filed in Taiwan, R.O.C. on Dec. 29, 2006, the entire contents of which are hereby incorporated by reference.

BACKGROUND OF THE INVENTION

1. Field of Invention

The present invention relates to a capacitor, and more particularly, to a face-centered cubic structure capacitor.

2. Related Art

Currently, the development of the SOC technology becomes increasingly matured and the integration of IC circuits is complicated, such that the quantity of the components accommodated in a unit area must be increased correspondingly. Therefore, many passive components that must be externally connected due to a large area thereof, such as capacitors and inductors, must be integrated into one chip.

In an IC layout, a plate capacitor is formed by different metal layers. By using a vertical electric field, with the reduction of effective line width, the occupied chip area is increased correspondingly. Furthermore, under the circumstance that the line width is reduced, with a limited area or volume, how to achieve the same capacitance is also a major technical problem of the IC layout. Thus, prior arts have provided many solutions.

For example, U.S. Pat. No. 5,208,725 discloses a capacitor structure having a first conductive layer and a second conductive layer. Each of the conductive layers consists of a plurality of stripe structures which are parallel to each other. The main technical features are that a finger structure is adopted and a lateral electric field and a vertical electric field are utilized to enhance the capacitance density.

U.S. Pat. No. 6,037,621 discloses a capacitor structure having a lower metal layer and an upper metal layer. An array of metal islands disposed between the lower and the upper metal layers, and each island of the array of islands is connected to either the upper layer or the lower layer. The main technical features are that the array of metal islands is realized through vias formed between the metals and a lateral electric field and a vertical electric field are utilized to enhance the capacitance density.

U.S. Pat. No. 6,297,524 discloses a capacitor structure having a first conductive layer and at least one second conductive layer. The conductive layers are formed of electrically conductive concentric ring-shaped lines which are arranged in concentric ring-shaped stacks. Each of the conductive layers is connected by a conductive via. The main technical features of the patent are that a concentric ring-shaped structure is utilized, a lateral electric field is utilized, and the upper and lower metals are penetrated by a via, so as to enhance the capacitance density.

U.S. Pat. No. 6,410,954 discloses a capacitor structure consisting of a first conductive layer and at least one second conductive layer. The conductive layers are formed of open-loop concentric ring-shaped lines and the second conductive layer covers the first conductive layer. The main technical features of the patent are that a ring-shaped structure is also utilized, and a lateral electric field and a vertical electric field are utilized by interlacing an upper metal and a lower metal, so as to enhance the capacitance density.

U.S. Early Publication No. 20040036143 discloses a capacitor structure, in which an inner vertical plate and an outer vertical plate are disposed on a substrate, a grid structure is defined by the outer vertical plate, and meanwhile a horizontal plate is disposed, so as to prevent parasitic capacitance from being generated between the substrate and the inner and outer vertical plates. The main technical features are that a grid structure is employed and a lateral electric field is utilized to enhance the capacitance density.

U.S. Pat. No. 6,737,698 discloses a capacitor structure, and the main technical features are that a mask structure is utilized to limit an electric field between two masks.

U.S. Pat. No. 6,765,778 discloses a capacitor structure consisting of a plurality of stacks. A second stack is a first nearest neighbor to a first stack, a third stack is a second nearest neighbor to the first stack, and each of the three stacks defines vertices of an isosceles triangle formed in a plane substantially perpendicular to the three stacks. The main technical features are that a hexagonal perpendicular stacking structure and a lateral electric field are utilized to enhance the capacitance density.

U.S. Early Publication No. 20040174655 discloses a capacitor structure mainly consisting of two layers of finger structures interlaced with each other. The main technical features are that the finger structures are utilized, and the finger structures on the upper and lower layers are perpendicularly interlaced, so as to reduce the unmatched conditions of the interlayer metals and enhance the capacitance density.

U.S. Early Publication No. 20050280060 discloses a capacitor structure, in which an inner box-shaped capacitor and an outer box-shaped capacitor are arranged in a concentric nested shape. The main technical features are that a concentric ring-shaped structure is utilized and a lateral electric field is utilized to enhance the capacitance density.

SUMMARY OF THE INVENTION

The present invention is directed to provide a face-centered cubic structure capacitor. The capacitance is achieved by using a lateral electric field of metal wires on the same layer. Thus, with the reduction of effective line width, the capacitance in a unit volume is increased, so as to enhance the capacitance density.

Examples of the present invention, a face-centered cubic structure capacitor comprises a first metal layer, a second metal layer, and a connection layer connecting the first metal layer and the second metal layer. The first metal layer comprises a plurality of first metal wires, a plurality of second metal wires, and a plurality of first metal blocks. The first metal wires and the second metal wires are intercrossed with each other to form a grid structure, and each of the first metal blocks is disposed in each grid of the grid structure. The second metal layer comprises a plurality of third metal wires, a plurality of fourth metal wires, and a plurality of second metal blocks. The third metal wires and the fourth metal wires are intercrossed with each other to form a grid structure, and each of the second metal blocks is disposed in each grid of the grid structure. The connection layer comprises a plurality of third metal blocks and a plurality of fourth metal blocks. Each of the third metal blocks connects each of the first metal blocks with the junction of each of the third metal wires and each of the fourth metal wires, and each of the fourth metal blocks connects each of the second metal blocks with the junction of each of the first metal wires and each of the second metal wires.

Examples of the present invention, a face-centered cubic structure capacitor comprises a plurality of first metal layers, a plurality of second metal layers, and a plurality of connection layers connecting the first metal layers and the second metal layers. The plurality of first metal layers comprises a plurality of first metal wires, a plurality of second metal wires, and a plurality of first metal blocks. The first metal wires and the second metal wires are intercrossed with each other to form a grid structure, and each of the first metal blocks is disposed in each grid of the grid structure. The plurality of second metal layers comprises a plurality of third metal wires, a plurality of fourth metal wires, and a plurality of second metal blocks. The third metal wires and the fourth metal wires are intercrossed with each other to form a grid structure, and each of the second metal blocks is disposed in each grid of the grid structure. Each of the first metal layers and each of the second metal layer are arranged in an interlaced manner. Each of the connection layers comprises a plurality of third metal blocks and a plurality of fourth metal blocks. Each of the third metal blocks connects each of the first metal blocks with the junction of each of the third metal wires and each of the fourth metal wires, and each of the fourth metal blocks connects each of the second metal blocks with the junction of each of the first metal wires and each of the second metal wires.

Examples of the present invention, a method of fabricating a face-centered cubic structure capacitor is provided. First, a first metal layer is formed, which includes a plurality of first metal wires, a plurality of second metal wires, and a plurality of first metal blocks. The first metal wires and the second metal wires are intercrossed with each other to form a grid structure, and each of the first metal blocks is disposed in each grid of the grid structure. Next, a connection layer is formed, which includes a plurality of third metal blocks and a plurality of fourth metal blocks. Each of the third metal blocks is connected to each of the first metal blocks, and each of the fourth metal blocks is connected to the junction of each of the first metal wires and each of the second metal wires. Finally, a second metal layer is formed, which includes a plurality of third metal wires, and a plurality of fourth metal wires, and a plurality of second metal blocks. The third metal wires and the fourth metal wires are intercrossed with each other to form a grid structure, and each of the second metal blocks is disposed in each grid of the grid structure. The second metal blocks are connected to the fourth metal blocks of the connection layer, and the third metal wires and the fourth metal wires are connected to the third metal blocks of the connection layer.

The capacitor structure provided by the present invention can be fully utilized under a limited volume, thereby solving a general problem that a plate capacitor occupies too much volume or area of a chip.

Furthermore, as a three-dimensional network structure is adopted, an electric field in all directions can be effectively utilized, thereby obtaining a higher capacitance value at the same volume, such that the chip area is relatively reduced, and the manufacturing cost is thus lowered. For the development and application of the SOC technique in the future, passive components can be integrated effectively, thus positively and substantially improving the performance thereof.

The above description of the content of the present invention and the following illustration of the embodiments are intended to demonstrate and explain the principle of the present invention and to provide further explanations of the claims of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

The detailed features and advantages of the present invention will be described in detail in the following embodiments. Those skilled in the arts can easily understand and implement the content of the present invention. Furthermore, the relative objectives and advantages of the present invention are apparent to those skilled in the arts with reference to the content disclosed in the specification, claims, and drawings.

Figure 1:
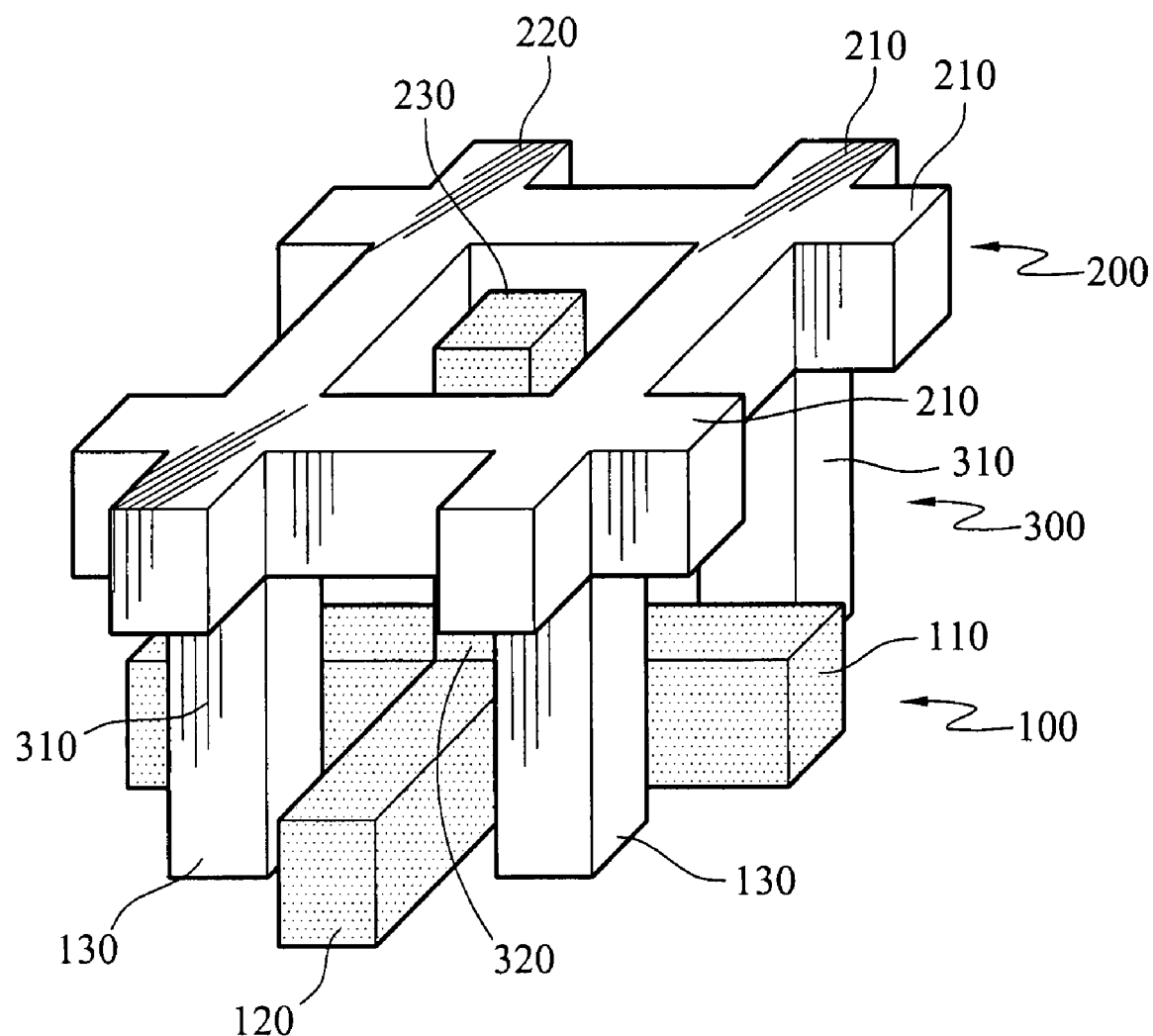
FIG. 1 is a schematic structural diagram of a face-centered cubic structure capacitor according to the present invention.
Figure 2A:
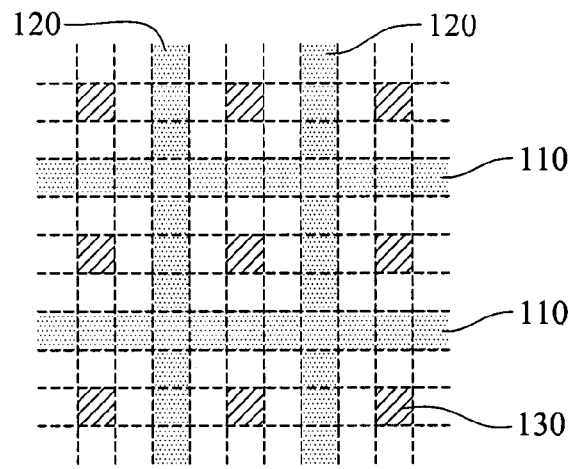
FIGS. 2A to 2C are schematic diagrams of a mask for fabricating the face-centered cubic structure capacitor according to the present invention.
Figure 2B:
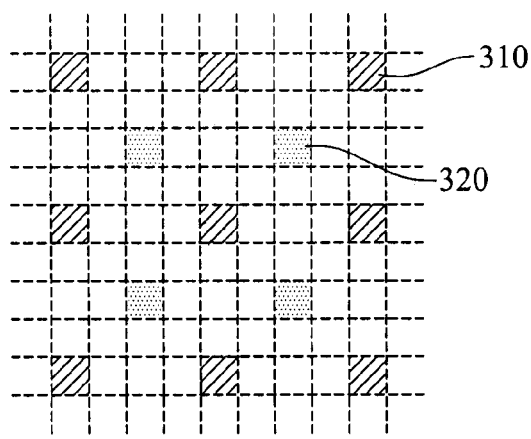
Figure 2C:
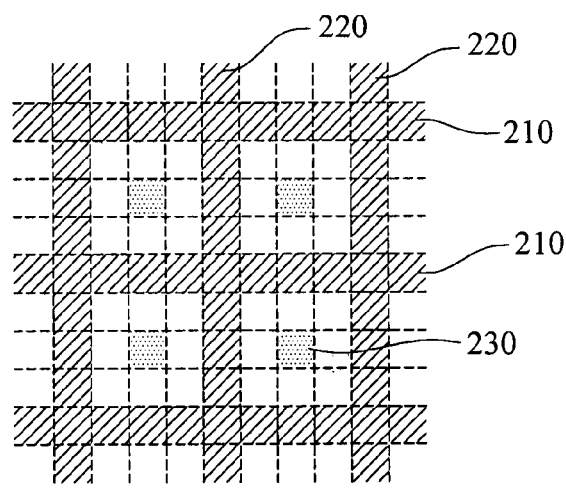

Referring to FIGS. 1, and 2A to 2C together, a face-centered cubic structure capacitor provided by the present invention is described below. FIG. 1 is a schematic structural diagram of a face-centered cubic structure capacitor according to the present invention. FIGS. 2A, 2B, and 2C are schematic diagrams of a mask for fabricating the face-centered cubic structure capacitor according to the present invention, which is used for assisting the illustration of the structure shown in FIG. 1.

As shown in the figures, the face-centered cubic structure capacitor comprises a tri-layer structure, i.e., a first metal layer 100, a second metal layer 200, and a connection layer 300.

The first metal layer 100 comprises a plurality of first metal wires 110, a plurality of second metal wires 120, and a plurality of first metal blocks 130. The first metal wires 110 and the second metal wires 120 are intercrossed with each other to form a grid structure. In this embodiment, the first metal wires 110 and the second metal wires 120 are, but not limited to, perpendicularly intercrossed, as long as the first metal wires 110 and the second metal wires 120 are intercrossed with each other to form a grid structure. Each of the first metal blocks 130 is disposed in each grid of the grid structure. The first metal wires are parallel to each other, and the second metal wires are parallel to each other.

The second metal layer 200 comprises a plurality of third metal wires 210, a plurality of fourth metal wires 220, and a plurality of second metal blocks 230. The third metal wires 210 and the fourth metal wires 220 are intercrossed with each other to form a grid structure. In this embodiment, the third metal wires 210 and the fourth metal wires 220 are, but not limited to, perpendicularly intercrossed, as long as the third metal wires 210 and the fourth metal wires 220 are intercrossed with each other to form a grid structure. Each of the second metal blocks 230 is disposed in each grid of the grid structure. The third metal wires are parallel to each other, and the fourth metal wires are parallel to each other.

The connection layer 300 comprises a plurality of third metal blocks 310 and a plurality of fourth metal blocks 320. Each of the third metal blocks 310 connects each of the first metal blocks with the junction of each of the third metal wires 210 and each of the fourth metal wires 220, and each of the fourth metal blocks 320 connects each of the second metal blocks 230 with the junction of each of the first metal wires 110 and each of the second metal wires 120.

A capacitor is formed through the grid structure formed by the first metal layer 100 and the second metal layer 200, and through the connection layer 300 connecting the first metal layer 100 and the second metal layer 200. Concerning the capacitor structure provided by the present invention, the capacitance is realized by a lateral electric field between metal wires on the same layer. Therefore, with the reduction of effective line width, the electric capacity in a unit area is increased.

In FIG. 1, a simplified structure is shown. An actual solid capacitor structure is obtained by extending the structure in FIG. 1, which is formed by repeating the first metal layer 100, the second metal layer 200, and the connection layer 300. Each of the first metal layers 100 and each of the second metal layers 200 are arranged in an interlaced manner, and each of the connection layers 300 connects each of the first metal layers 100 and each of the second metal layers 200.

Though not shown, the gaps between the metal wires are filled with a dielectric material.

In an IC layout, a plate capacitor is usually formed by different metal layers. By using a vertical electric field in this kind of capacitor, with the reduction of effective line width, the occupied chip area is increased accordingly.

The face-centered cubic structure capacitor provided by the present invention can be achieved through a standard CMOS process. Referring to FIGS. 4A to 4D, exemplary processes of fabricating a face-centered cubic structure capacitor provided by the present invention are shown. For example, in FIGS. 4A to 4D, the section of FIG. 1 is shown for illustration, together referring to FIGS. 2A to 2C.

Figure 4A:
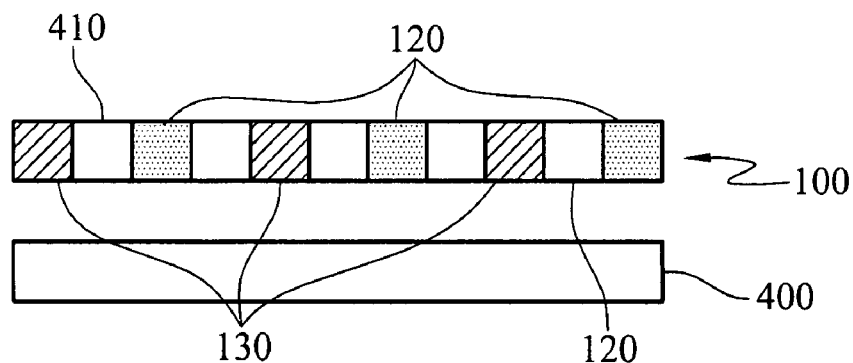
FIGS. 4A to 4E show the process flow of fabricating the face-centered cubic structure capacitor according to the present invention.

Referring to FIG. 4A, the capacitor is formed on a substrate 400. In an embodiment, other components or circuits may also be formed on the substrate 400, but for the sake of simplicity, these components or circuits are not described or shown in the figure.

A first metal layer 100 is formed first, and seen from the section of FIG. 1, the first metal layer 100 comprises a second metal wires 120 and a first metal blocks 130. Actually, the drawing is shown in FIG. 2A, i.e., forming a first metal layer 100 which comprises a plurality of first metal wires 110, a plurality of second metal wires 120, and a plurality of first metal blocks 130. The first metal wires 110 and the second metal wires 120 are intercrossed with each other to form a grid structure, and each of the first metal blocks 130 is disposed in each grid of the grid structure. Next, a dielectric material 410 is filled into the gaps of the first metal layer 100.

In another embodiment, a dielectric layer can also be formed first, and is exposed and developed with a mask as shown in FIG. 2A. In this manner, the portions are etched for forming the first metal wires 110, the second metal wires 120, and the first metal blocks 130, and a metal material is then deposited to the corresponding positions.

Figure 4B:
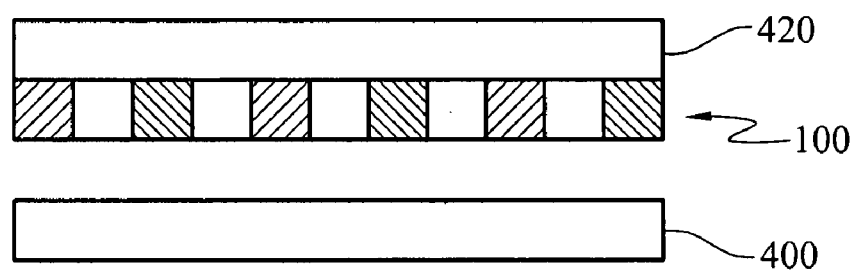
Figure 4C:
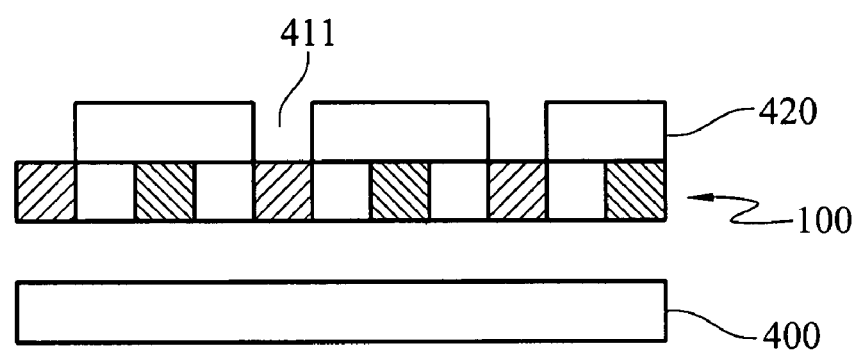
Figure 4D:
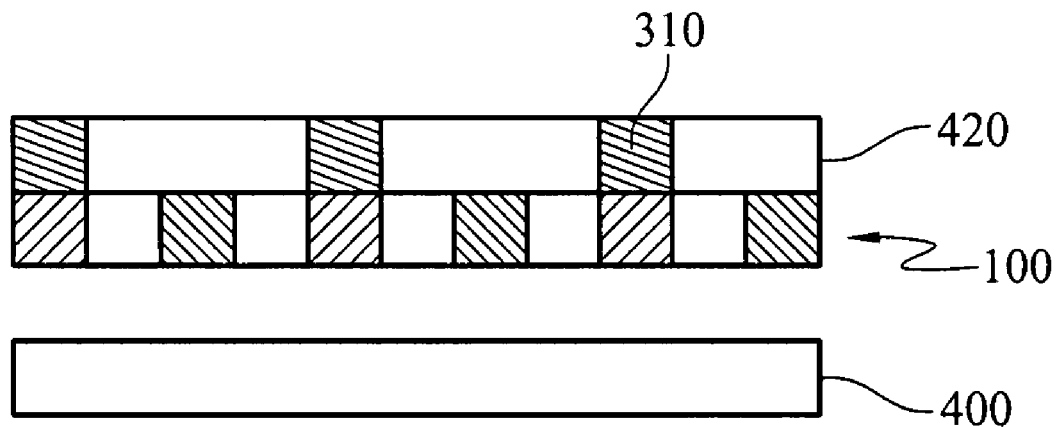

Referring to FIGS. 4B to 4D, a connection layer 300 is then formed. During the process, a dielectric layer 420 is formed first and then exposed and developed with a mask as shown in FIG. 2B, so as to form vias 411 which are filled with a metal afterwards. Only the third metal blocks 310 can be seen in the figure, which is in fact shown in FIG. 2B, i.e., the connection layer 300. The connection layer 300 comprises a plurality of third metal blocks 310 and a plurality of fourth metal blocks 320. Each of the third metal blocks 310 is connected to each of the first metal blocks, and each of the fourth metal blocks 320 is connected to the junction of each of the first metal wires 110 and each of the second metal wires 120.

In another embodiment, the connection layer 300 can also be formed first, and the dielectric material is then filled into the gaps of the connection layer 300.

Figure 4E:
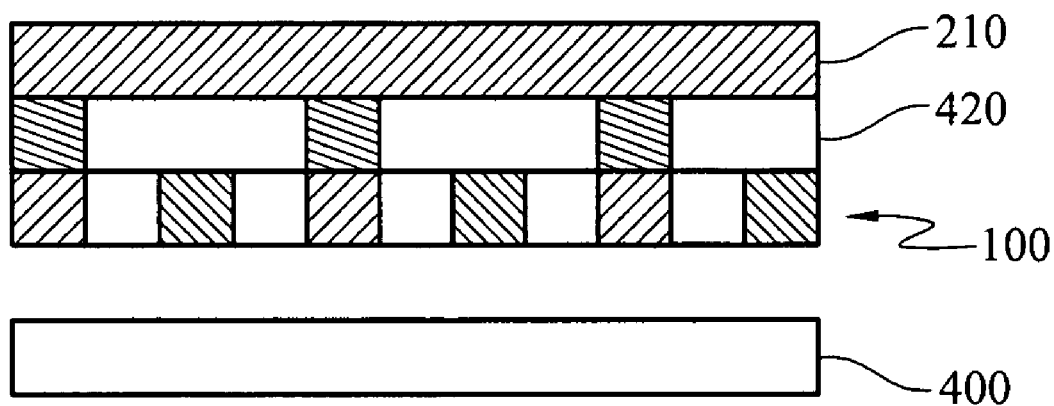

Referring to FIG. 4E, a second metal layer 200 is formed and is exposed and developed with a mask as shown in FIG. 2C. The second metal layer 200 comprises a plurality of third metal wires 210, a plurality of fourth metal wires 220, and a plurality of second metal blocks 230. The third metal wires 210 and the fourth metal wires 220 are intercrossed with each other to form a grid structure, and each of the second metal blocks 230 is disposed in each grid of the grid structure. The second metal blocks 230 are connected to the fourth metal blocks 320 of the connection layer 300. The third metal wires 210 and the fourth metal wires 220 are connected to the third metal blocks 310 of the connection layer 300. Finally, a dielectric material is filled into the gaps of the second metal layer 200 (not shown).

In another embodiment, a dielectric layer can also be formed first, and is exposed and developed with a mask as shown in FIG. 2C. In this manner, the portions are etched for forming the third metal wires 210, the second metal wires 220, and the second metal blocks 230, and a metal material is then deposited to the corresponding positions.

Figure 3:
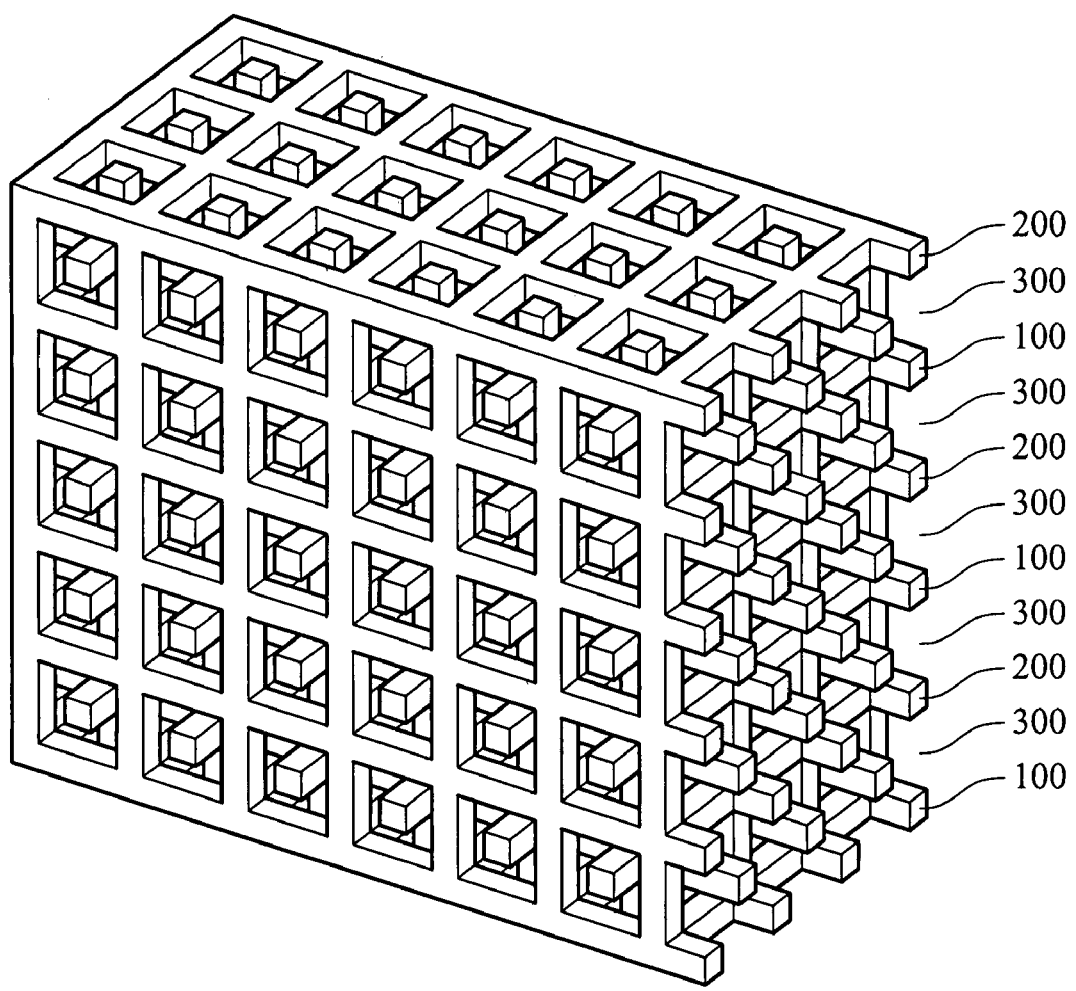
FIG. 3 is a schematic structural diagram of a face-centered cubic structure capacitor according to the present invention.

The structure as shown in FIG. 3 is formed by repeating the above steps.

Concerning the capacitor structure provided by the present invention, the capacitance is realized by a lateral electric field between metal wires on the same layer. Therefore, with the reduction of effective line width, the electric capacity in a unit area is increased. That is, for the same capacitance value, the capacitor structure provided by the present invention can effectively save the area required by the layout, thereby reducing the manufacturing cost of the chip.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A face-centered cubic structure capacitor, comprising:
   a first metal layer, comprising a plurality of first metal wires, a plurality of second metal wires, and a plurality of first metal blocks, wherein the first metal wires and the second metal wires are intercrossed with each other to form a grid structure, and each of the first metal blocks is disposed in each grid of the grid structure;
   a second metal layer, comprising a plurality of third metal wires, a plurality of fourth metal wires, and a plurality of second metal blocks, wherein the third metal wires and the fourth metal wires are intercrossed with each other to form a grid structure, and each of the second metal blocks is disposed in each grid of the grid structure; and
   a connection layer, comprising a plurality of third metal blocks and a plurality of fourth metal blocks, wherein each of the third metal blocks connects each of the first metal blocks with junction of each of the third metal wires and each of the fourth metal wires, and each of the fourth metal blocks connects each of the second metal blocks with junction of each of the first metal wires and each of the second metal wires.

2. The face-centered cubic structure capacitor as claimed in claim 1, wherein the first metal wires are parallel to each other, and the second metal wires are parallel to each other.

3. The face-centered cubic structure capacitor as claimed in claim 1, wherein the third metal wires are parallel to each other, and the fourth metal wires are parallel to each other.

4. The face-centered cubic structure capacitor as claimed in claim 1, wherein the first metal wires and the second metal wires are perpendicularly intercrossed with each other to form the grid structure.

5. A face-centered cubic structure capacitor, comprising:
a plurality of first metal layers, comprising a plurality of first metal wires, a plurality of second metal wires, and a plurality of first metal blocks, wherein the first metal wires and the second metal wires are intercrossed with each other to form a grid structure, and each of the first metal blocks is disposed in each grid of the grid structure;
a plurality of second metal layers, comprising a plurality of third metal wires, a plurality of fourth metal wires, and a plurality of second metal blocks, wherein the third metal wires and the fourth metal wires are intercrossed with each other to form a grid structure, each of the second metal blocks is disposed in each grid of the grid structure, and each of the first metal layers and each of the second metal layers are arranged in an interlaced manner; and
a plurality of connection layers, each of the connection layers connecting each of the first metal layers and each of the second metal layers, wherein each of the connection layers comprises a plurality of third metal blocks and a plurality of fourth metal blocks, each of the third metal blocks connects each of the first metal blocks with junction of each of the third metal wires and each of the fourth metal wires, and each of the fourth metal blocks connects each of the second metal blocks with junction of each of the first metal wires and each of the second metal wires.

6. The face-centered cubic structure capacitor as claimed in claim 5, wherein the first metal wires are parallel to each other, and the second metal wires are parallel to each other.

7. The face-centered cubic structure capacitor as claimed in claim 5, wherein the third metal wires are parallel to each other, and the fourth metal wires are parallel to each other.

8. The face-centered cubic structure capacitor as claimed in claim 5, wherein the first metal wires and the second metal wires are perpendicularly intercrossed with each other to form the grid structure.

9. A method of fabricating a face-centered cubic structure capacitor, comprising:
forming a first metal layer, the first metal layer comprising a plurality of first metal wires, a plurality of second metal wires, and a plurality of first metal blocks, wherein the first metal wires and the second metal wires are intercrossed with each other to form a grid structure, and each of the first metal blocks is disposed in each grid of the grid structure;
forming a connection layer, comprising a plurality of third metal blocks and a plurality of fourth metal blocks, wherein each of the third metal blocks is connected to each of the first metal blocks, and each of the fourth metal blocks is connected to junction of each of the first metal wires and each of the second metal wires; and
forming a second metal layer, comprising a plurality of third metal wires, a plurality of fourth metal wires, and a plurality of second metal blocks, wherein the third metal wires and the fourth metal wires are intercrossed with each other to form a grid structure, each of the second metal blocks is disposed in each grid of the grid structure, the second metal blocks are connected to the fourth metal wires of the connection layer, and the third metal wires and the fourth metal wires are connected to the third metal wires of the connection layer.

10. The fabrication method as claimed in claim 9, further comprising a step of filling a dielectric material into gaps of the first metal layer.

11. The fabrication method as claimed in claim 9, further comprising a step of filling a dielectric material into gaps of the connection layer.

12. The fabrication method as claimed in claim 9, further comprising a step of filling a dielectric material into gaps of the second metal layer.

* * * * *